United States Patent [19]
Eberhardt et al.

[11] Patent Number: 5,791,917
[45] Date of Patent: Aug. 11, 1998

[54] APPARATUS AND METHOD FOR ESTABLISHING AN ELECTRICAL AND/OR AN OPTIC CONNECTION

[75] Inventors: Regina Eberhardt, Calw; Frank Notter, Nufringen; Willi Recktenwald, Holzgerlingen; Andreas Renner, Ammerbuch, all of Germany

[73] Assignee: International Business Machines Corporation, Armonk, N.Y.

[21] Appl. No.: 698,381

[22] Filed: Aug. 15, 1996

[51] Int. Cl.$^6$ ................................. H01R 4/58
[52] U.S. Cl. ......................... 439/79; 439/377
[58] Field of Search ............... 439/492, 61, 74, 439/377, 328, 327, 79

[56] References Cited

U.S. PATENT DOCUMENTS 4,723,196  2/1988  Hofmeister et al. ............... 361/399
5,381,314  1/1995  Rudy et al. ........................ 439/79

FOREIGN PATENT DOCUMENTS 65268  1/1969  Germany ........................... 439/492

Primary Examiner—Khiem Nguyen
Assistant Examiner—Eugene G. Byrd
Attorney, Agent, or Firm—Marc A. Ehrlich

[57] ABSTRACT

The invention relates to an apparatus for establishing an electrical and/or optic connection of a first and a second component with a third component with connection means 14, 15 for electrical and/or optic connection of the first and second component with each other, whereby the connection means 14, 15 allow mechanical free-play between the first and second component, with a connection link 13, 16 each for the first and the second component for electrical and/or optic connection of the first and the second with a third component, and with an apparatus 31, 32, 33, 34 for limitation of the mechanical free-play between the first and the second component.

20 Claims, 5 Drawing Sheets

APPARATUS AND METHOD FOR ESTABLISHING AN ELECTRICAL AND/OR AN OPTIC CONNECTION

FIELD OF THE INVENTION

The invention relates to an apparatus for establishing an electrical and/or an optic connection.

BACKGROUND OF THE INVENTION

Electrical and optic connections, especially plug connections, are in actual practice subjected to high demands, since they must ensure that the contact created by the connection is not broken under different operational stresses such as vibration, temperature differentials, etc. In addition, these connections should be user-friendly in terms of establishing and releasing the connection.

In order for a plug connection to comply with these demands, an interlocking apparatus is required, for shifting and releasing the parts of the plug connection. With such an apparatus one may ensure that all of the contacts are closed and that the contacts do not release by themselves during operation.

In European Patent Application EP 03 69 025, an apparatus is described with which cards can be connected with the board and then released. The apparatus consists of an elastic latching device which is connected with the card, whereby the latching device has a movable end-piece and a rotating operation lever which is mounted on the card. The operation lever and latching device are arranged in such a way that, when the operation lever is rotated, the latching device performs a translational motion because of the curved surface of the operation lever, through which movement a connection is created between the card and the board. If an effective connection is created, the movable end-piece falls into a groove provided on the operation lever and remains in this position, through which the card is fixed in this position. A disadvantage of this type of device is that the pressure exerted by the insertion force constantly applies a load on the board, so that the board is under high stress during the connection with the card. In addition, it is quite possible that the insertion force, as a result of the number of contacts made by the plug connection, is so great that the board will be bent. Moreover, the continuous bending of the board leads to cracks in the board, so that the circuits printed thereon will be damaged. A further disadvantage of this device results from the fact that, due to the aforementioned problems, the number of contacts which may be established by a plug connector is limited, that is, that large cards with a high number of contacts cannot be locked by this device. The functions must therefore be distributed to multiple cards, which has larger housings as a result.

An apparatus of the type described initially for locking and releasing of a connection for electrical plug contacts is described in the IBM Technical Disclosure Bulletin, Vol. 31, No. 11, April 1989, pp. 76–80. This apparatus consists of latches which are arranged on the upper and lower edges of the card or the protective housing, and of detents which are attached to the housing. A detent is functionally allocated to each latch in such a way that the latch can only engage with the detent when an effective connection has been established between the card and the board. A significant disadvantage of this apparatus exists in that the force which is required for the connection of the card with the board places a stress on the parts of the plug connector during the entire operation. This apparatus also displays the same disadvantages which are listed for the European Patent Application EP 03 69 025.

An apparatus is published in U.S. Pat. No. 2,993,187 in which latches engage with spring-mounted supports which are mounted on the housing. By this arrangement, the forces on the circuit board are effected diagonally to the insertion apparatus.

An apparatus for connecting and releasing of a plug connector is known from DE 4042060 C1. The apparatus consists of rotating latches which are arranged in the area of the lower and upper corner of a protective housing or of a card, and of flexibly arranged parts, especially springs, which are attached either on an inflexible detent piece or directly on the housing. A driver is located on the flexible parts.

A disadvantage which is common to all of the aforementioned apparatuses is that only a relatively limited number of connectors may be established. Especially with plug connectors, the specific problem occurs that with the increasing number of contact pins, the insertion force which must be applied increases. However, the insertion force may not exceed a specified maximum in order to avoid damage to the printed circuit boards, and to prevent the necessity for an expensive mechanical construction for the application of the required insertion force. For example, the maximum number of connections which may be established with the apparatus known from DE 40 42 060 is 600 connections for one printed-circuit board.

FIG. 1 depicts such an apparatus as is known from DE 40 42 060. As FIG. 1 depicts, one or more cards 3 are inserted next to one another into the housing 1 and connected inside the housing with the board 5. The cards 3, especially when they are electronic cards, are generally positioned in a protective housing 6 to shield against electromagnetic radiation. This protective housing 6 is formed in such a manner that it has an opening from which the contact link 4 projects, which is connected with the contact link 7 of the board 5. In both the upper and lower corners on one side of the protective housing 6 there is a latch 9, both of which are pivot-mounted in the protective housing 6. To the extent that it is possible for technical reasons to dispense with the protective housing 6 for shielding the card 3, the securing of the latch 9 is possible directly on the card 3.

On the housing 1 there are detents 11 in both the upper and lower area, in which the latches 9 cannot engage until an effective connection between the contact link 7 of the board 5 and the contact link 4 of the card as been established. The detents 11 may be mounted on the housing 1 either individually or attached as a unit in one piece.

The contact link 4 may as an example be a so-called 600-pin connector. An increase in the number of pins beyond 600 would make an insertion force necessary which is too high to be applied through physical force, and would in addition damage the card 3 or its housing 6.

Highly-complex circuits are installed more and more on printed-circuit boards, which make a high number of connections for communication with the surrounding environment necessary, especially with other printed circuit boards.

The object of the invention is therefore to create an apparatus for the establishing of an electrical or optic connection, which makes the establishing of a larger number of connections possible.

The underlying problem which forms the basis of the invention is resolved through the characteristics of the independent claims.

SUMMARY OF THE INVENTION

The number of connections which can be established between two components—for instance between a card 3 and a board 5—is limited. If the complexity of a first component, which is to be connected to another component, requires a greater number of connections than may be established by a traditional apparatus, due for example to the complexity of the circuits which are implemented in the first component, the invention proceeds as follows: Instead of a single first component, the function of this component is realized by two components, that is, distributed in construction to two components. As an example, this may be achieved in that a first portion of the highly-complex circuits is implemented on the first component and a second portion of the highly-complex circuits is implemented on the second component. The first and the second component may then be formed as printed-circuit boards, for example. In order to produce the required functioning as a whole, the first and the second components must be connected with each other. The connecting means provided for this allows a mechanical free-play between the two components. Both components have a connection link, for example a 600-pin connector, for connection with the third component, for example with the board 5.

Because of the mechanical free-play between the first and second component, it is now possible to connect the two components separately with the third component, even though they functionally form a single unit, in other words to insert them into the board 5. This has the advantage that an insertion force is applied twice in a row which does not exceed a specified maximum.

The connection means for electrical and/or optic connection of the first and the second component with each other may be flexible. Flexible conductors or flexible foil-conductors, which consist of a number of conductors are suited for this. Such foil conductors are known within the current technological state of the art.

In order to ensure the holding force of the first and the second component with each other, the apparatus in accordance with the invention has in addition an apparatus to limit the mechanical free-play between the first and the second component.

The apparatus for limiting the mechanical free-play may have a first and a second linking element which engage with each other and which may be shifted toward each other. Stop elements limit the shift-range in two directions. Preferably the shift range of the first and the second component with each other is allowed in a direction which essentially corresponds to the direction of the insertion of the components into the third component, that is, into the board 5.

The apparatus for limiting the mechanical free-play may be also realized using the housings of the first and the second components. One of the two connection elements can be permanently mounted on the housing, while the other connection element is formed as a recess in the other housing.

Similarly, one or more of the stop elements which limit the mechanical free-play may be realized by the means of the housings. A first stop element may be permanently attached to one of the housings, and project into a recess of the other housing. A second stop element may then be formed at the edge of the first connection element, as an example, on the limit of the recess in the direction of the insertion movement. Through this, stops are formed in the forward and rearward directions, which-presupposing that the apparatus for limiting the mechanical free-play only allows free-play of the first and the second components in the direction of the insertion- effectively limits the free-play between the components, and thus damage to the connection means is avoided. This is especially of significance for foil conductors which may consist of up to 600 conductors.

In order to ensure problem-free insertion movement of the first and the second components, guide elements may be formed on at least one of the housings which serve to guide the relative movement between the first and the second components. Through this, it is especially avoided that the first or the second component become tilted through the relative movement. In addition, the upper edges of the housing of the first and the second component may, as an example, be formed as guide-rails in order to facilitate the insertion movement. This is known per se, especially from DE 40 42 060.

A multiple of insertions, which consist of at least one first and one second component and have an apparatus in accordance with the invention may be plugged into a common third component, such as a board 5. In this manner, a functional unit of a computer system may be formed in a housing 1.

The invention is not limited to establishing a connection between a first and a second component with a third component, but rather the theory of the invention is also applicable to the connection of more than two components with each other and with a common additional component, such as a board 5. The connection means can then connect these components with one another, and the apparatus for limiting the mechanical free-play may similarly limit the free-play of these components with one another. In this manner, it is possible to connect these components separately with an additional component in each instance, even though they form a structural and functional unit.

An embodiment of the invention is represented in the drawing and is described in the following in more detail.

BRIEF DESCRIPTION OF THE DRAWINGS

Depicted are.

DETAILED DESCRIPTION OF PREFERRED EMBODIMENT

Figure 3:
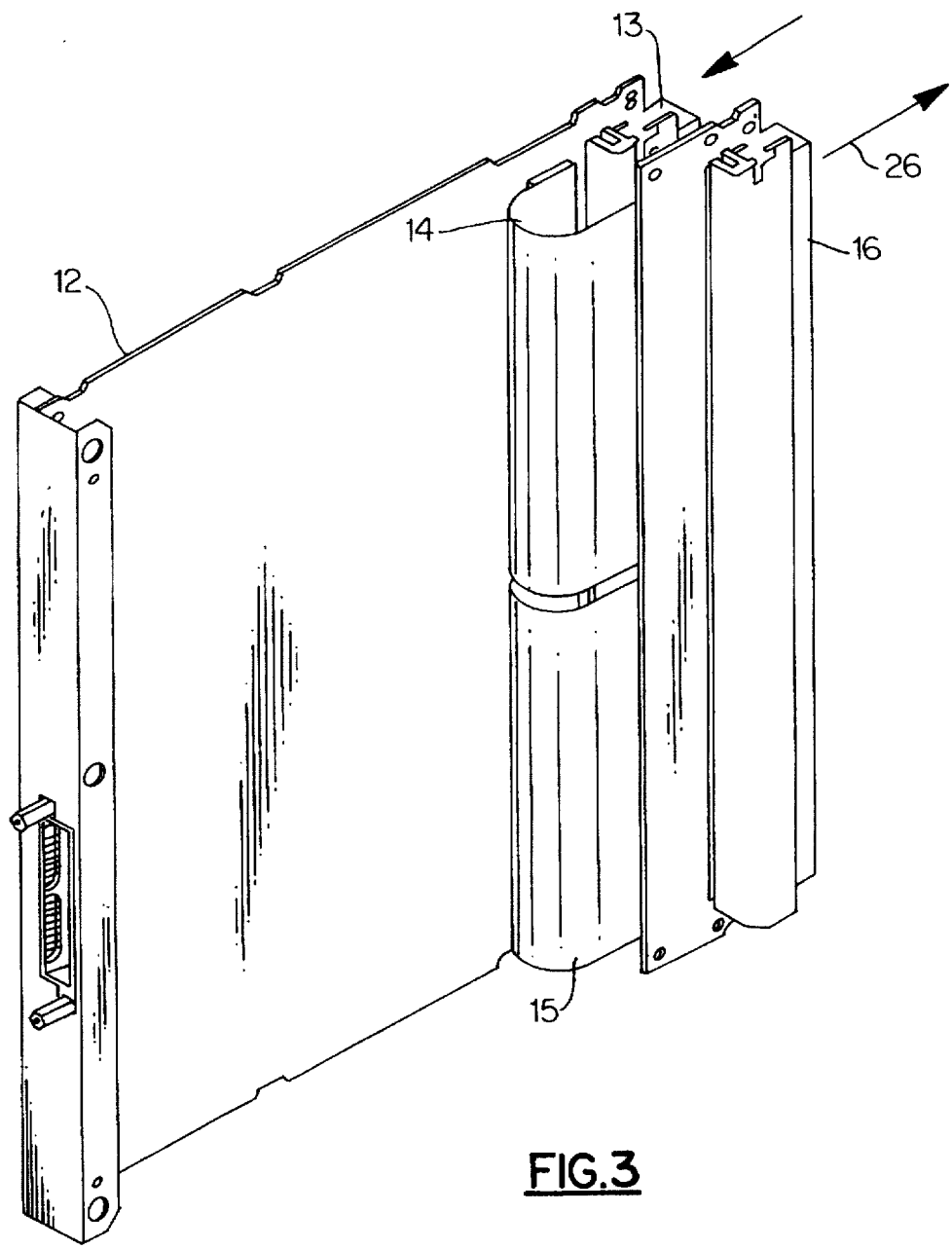

FIG. 3 depicts the first component 12, which in this embodiment is constructed as a circuit board. The first component has a connection link 13. The connection link 13 is a 600-pin connector for establishing 600 connections with the board 5, shown in FIG. 1. The connection link 13 is permanently attached to the first component 12. The connection link 13 is connected electrically with a connection link 16 by two flexible foils 14 and 15. The foils 14 and 15 contain a number of copper wires.

The connection link 16 belongs to a second component which is not depicted in FIG. 3. The first and the second components are connected to each other by the connection of connection links 13 and 16 through the flexible foils 14 and 15. Because of the flexibility of the conducting foils, there is mechanical free-play between the first and the second component.

Figure 1:
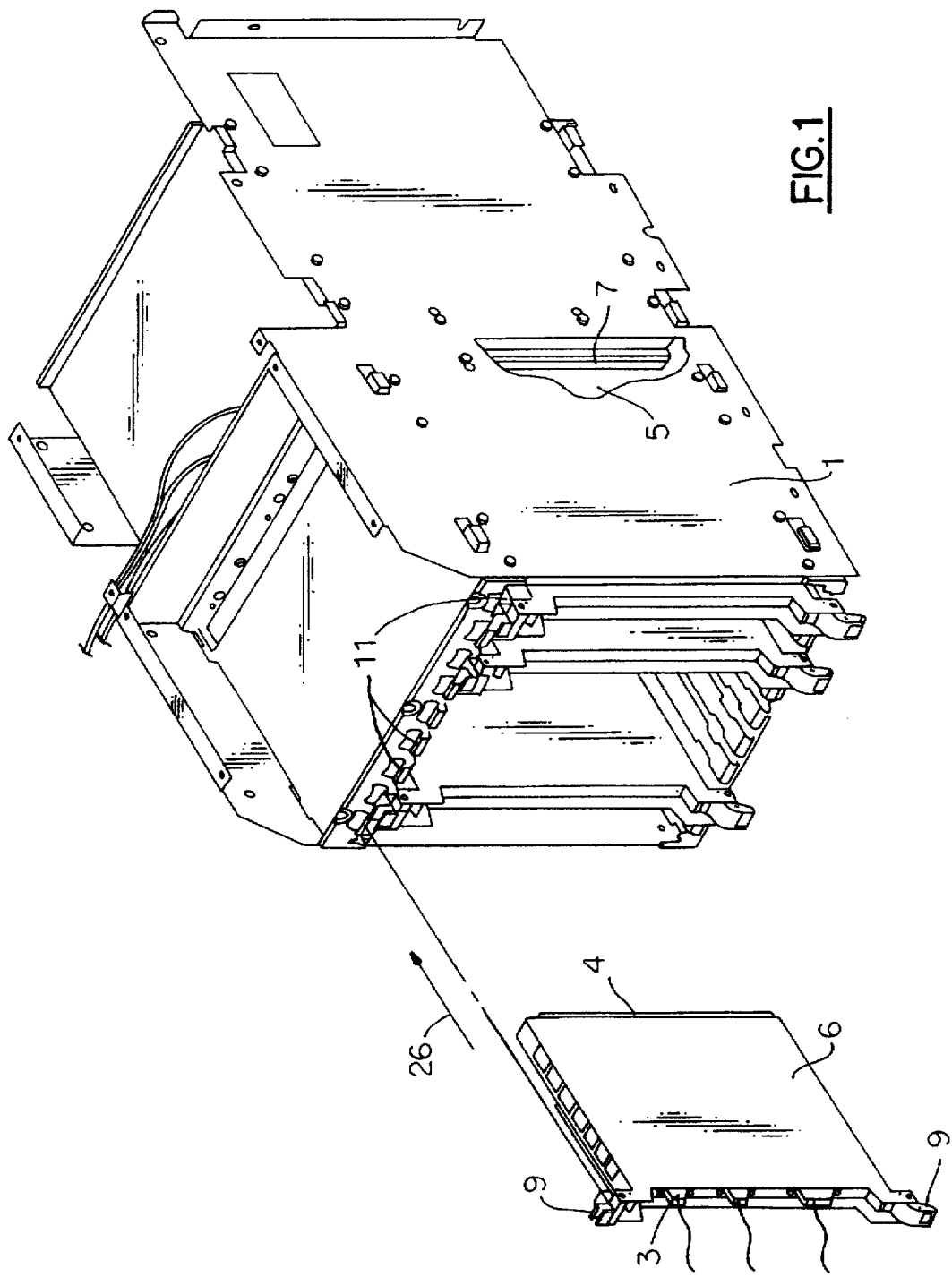
FIG. 1 a three-dimensional view of a card and a housing for receiving several such cards in accordance with the current technical state of the art, FIG. 2 a three-dimensional view of an apparatus according to the invention, in which the first and the second components are each surrounded by a housing, FIG. 3 a three-dimensional partial view of the apparatus represented in FIG. 2, FIG. 4 an exploded three-dimensional view of the first component and the parts of the apparatus of FIG. 2 which belong to it, and FIG. 5 an exploded three-dimensional view of the second component and the parts of the housing of FIG. 2 which belong to it.
Figure 4:
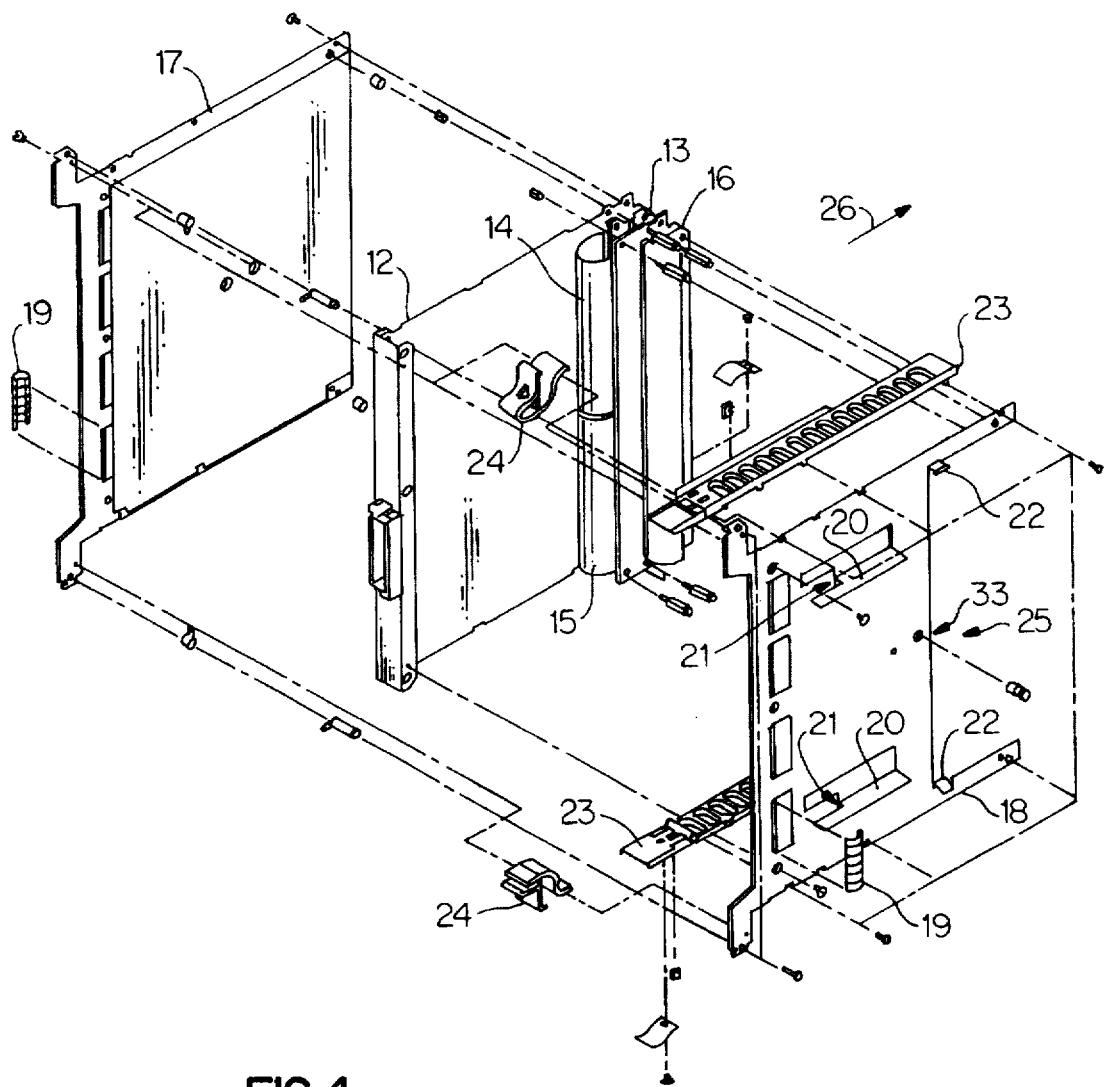

FIG. 4 depicts the housing parts 17 and 18 of the housing of the first component 12. The housing of the first component 12 serves also for electromagnetic shielding. The springs 19, which are attached to the housing parts 17 and 18, serve to establish electrical contacts with the adjacent housings of other components as soon as the components are inserted next to each other as depicted in FIG. 1. This also serves to shield the individual components.

Two first connection elements 20 are permanently attached on the housing part 18. Each of the first connection elements 20 has a recess in direction 26 of the insertion movement. Stop elements 21 are formed at an edge of the recess by the recesses. Additional guide elements 22 are attached to the housing part 18.

The housing part 18 has a rectangular-shaped recess 25. The shorter edges of the rectangular-shaped recess 25 point in the direction of the insertion movement 26. The upper and lower limits of the housing of the first component, that is, the upper and lower portions of the housing, are constructed as rail-shaped elements 23. On each of the upper and lower edges of the housing there latches 24, which correspond to the latches 9 (refer to FIG. 1) known to the current technological state of the art.

Figure 5:
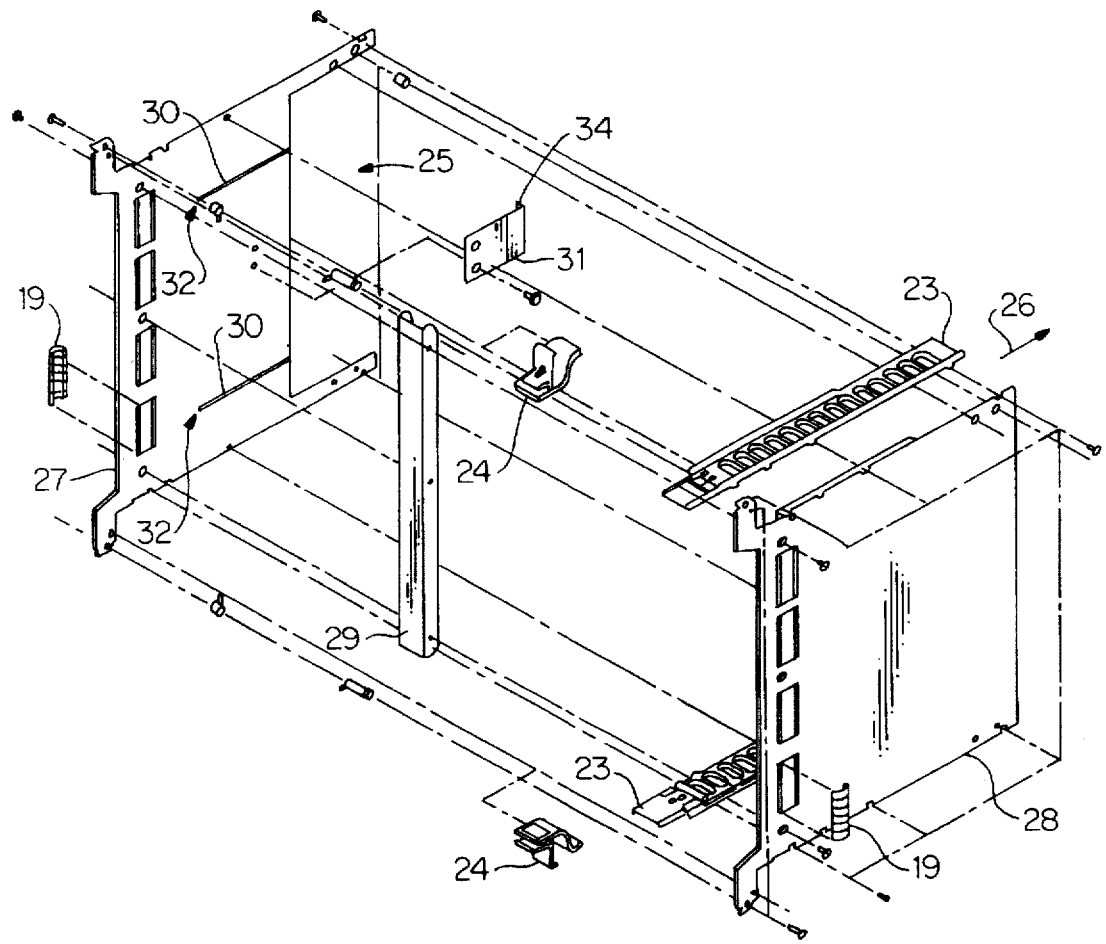

FIG. 5 depicts the housing of the second component. The second component may similarly be a circuit board. The second component, which is not depicted in FIG. 5, is held in place by the closing piece 29. The housing of the second component consists further of housing parts 27 and 28, as well as of the two additional rail-shaped elements 23 for upward and downward limiting of the housing.

The housing part 27 has a rectangular-shaped recess 25, just as the housing part 18 of the fist component. In an assembled state, the housing part 18 of the first component and the housing part 27 of the housing for the second component are arranged directly adjacent to each other and in contact with each other through the spring 19. The housing part 27 has two slot-shaped recesses 30, which extend in the direction of the insertion movement 26. The recesses 30 serve to receive the first connection elements 20. The connection elements 20 each engage with their recess in the recesses 30 in the housing part 27. Therefore, a second connection element is realized through the recess 30 in the housing part 27.

Furthermore, an angled-shaped stop element 31 is permanently attached on the housing part 27. The stop element 31, that is, its angle-shaped projection, extends through the recess 25 of the housing part 27 into the recess 25 of the housing part 18.

Since the connection elements 20 engage with their recesses in the recesses 30 in the housing part 27, free-play of the first and second components with each other, essentially in the direction of the insertion movement 26, is ensured. This free-play is limited in one way in that the first connection elements 20 reach the rear limit 32 of the recesses 30 in the housing part 27.

Also, the free-play in the opposite direction is limited by the stop element 31, specifically at the point when the angle-shaped projection of the stop element 31 makes contact in the area 33 of the housing edge formed by the recess 25 at the housing part 18. The angle-shaped projection of the stop element 31 is then in contact in an area 34 of this angle-shaped projection with the area 33 of the housing part 18.

It is thus ensured for one thing that adequate mechanical free-play exists between the two housings, and in addition, that the housings are held together and mechanically form a unit. The mechanical free-play in this is exactly as great as is required so that damage to the flexible foils 14 and 15 is avoided.

Figure 2:
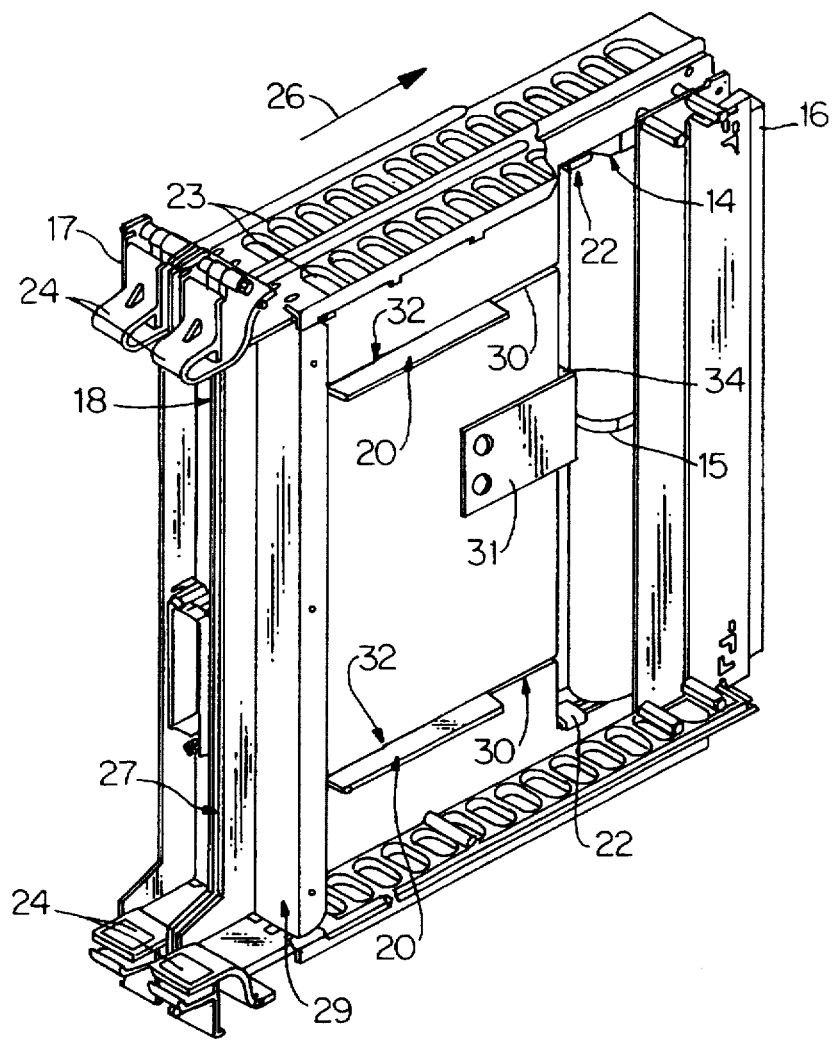

FIG. 2 depicts the housings of FIGS. 4 and 5 in an assembled state. Housing part 28 and the second component are not actually represented in FIG. 2, in order to show the combined effect of the connection elements 20 and 30 as well as that of the stop elements 31 and 34 with the corresponding recess 25 of the housing part 18.

The engagement of the guide elements 22 in the recess 25 of the housing part 27 is additionally depicted in FIG. 2. The slide-in panel depicted in FIG. 2 may now be accommodated in the aforementioned housing 1 together with other aforementioned cards 3. It is a special advantage of the slide-in panel in accordance with the invention that it is compatible with slide-in panels known from the present technological state of the art. Upon insertion of the slide-in panel shown in FIG. 2 into the housing 1, two free plug-in places, located adjacent to each other, are required on the board 5. Because of the mechanical free-play between the two components, it is possible to first connect one of the two components with the latch 9 to the board 5 and, independently thereupon, to subsequently connect the remaining component with the board 5 in the same manner. To achieve this, there is a relative movement of the two components with each other which is made possible by the connection elements and the apparatus for limitation of the mechanical free-play.

Although preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention as defined in the following claims which should be construed to maintain the proper protection for the invention first disclosed.

Having described our invention, what we claim as new and desired to secure by Letters Patent is as follows:

1. An apparatus for establishing an electrical and/or optic connection of a first and a second component with each other and between the first component and a third component and the second component and the third component, said apparatus including:

a first connecting means (14, 15) for the electrical and/or optic connection of the first and second component with each other, wherein the connecting means physically couples the first component to the second component and allows a mechanical free-play between the first and the second component;

a second connecting means (13, 16) for each of the first and second component for an electrical and/or optic connection of the first component with the third component and for an electrical and/or optic connection of the second component with the third component; and an apparatus to limit the mechanical free-play (20, 21, 30, 31, 32, 34) between the first and second component to a predefined range of movement.

2. An apparatus according to claim 1, in which the first connection means include a flexible conductor.

3. An apparatus according to claim 1 wherein the first connection means includes a flexible foil-conductor having multiple conductors.

4. An apparatus according to claim 1, wherein the second connection means each consist of a contact strip, which preferably allows up to 600 connections and wherein the contacts thereon are preferably constructed as contact pins.

5. An apparatus according to claim 1, wherein the apparatus has a first and a second attachment element (20, 32) for limitation of the mechanical free-play, whereby the connection elements engage with one another and are displaceable toward one another, and one or more stop elements (21, 32, 33, 34) which limit the displacement in two directions.

6. An apparatus according to claim 5, wherein the first and the second components are each located in a housing (17, 18, 27, 28).

7. An apparatus according to claim 6, wherein the housing further provides electromagnetic shielding of the first and second components.

8. An apparatus according to claim 6, wherein the first attachment element (20) is attached to the housing (18) of the first component, and the first attachment element includes a recess in the direction of an insertion movement (26) of the first and the second component for the establishing of a connection.

9. An apparatus according to claim 6, in which the second attachment element (30) is realized in the housing (27) of the second component as a recess in which the first connection element engages.

10. An apparatus according to claims 6, wherein a first stop element is structured as an angle-shaped element, (31) and the first stop element is permanently attached with one of the housings (27).

11. An apparatus according to claim 10, wherein the first stop element is structured as a right-angle or as a hook-shaped element.

12. An apparatus according to claim 10, wherein the first stop element projects into a recess (25) of one of the housings, and wherein a second stop element (21) is formed at the corner of the first attachment element (20).

13. An apparatus according to claim 6, wherein the apparatus further includes guide elements (22) for guiding the first and second housing toward each other during an insertion movement (26).

14. An apparatus according to claim 13, wherein the guide elements are formed as angle-shapes or hook-shapes, and are permanently connected with one of the housings, and engage in a recess (25) in the other housing, whereby the recess (25) in the other housing extends in the direction of the insertion movement (26).

15. An apparatus according to claim 13, wherein the recess (25) in the housing is essentially rectangular and the shorter side of the recess (25) points in the direction of the insertion movement (26) and wherein a limiting element (33) for the first stop element (31, 34) is formed in an area (33) by the longer side of the recess (25).

16. An apparatus according to claim 1, wherein the components are constructed as printed circuit boards.

17. An apparatus according to claim 5, wherein a limit (23) of the first and second housing in the direction of an insertion movement of the first and the second component is constructed in a rail-form for establishing a connection.

18. A slide-in panel for an electrical or electronic device, with a first and a second printed circuit board and an apparatus according to claim 1.

19. A computer system or functional unit of a computer system with a housing for receiving of one or more of the slide-in panels according to claim 18.

20. A method for establishing an electrical and/or optic connection of a first and a second component with a third component by means of an apparatus according to claim 1 wherein either the first or the second component is first connected with the third component, said method comprising the steps of:

connecting said first and second component with each other via said first connecting means (14, 15) for the electrical and/or optic connection of the first and second component with each other, wherein the connecting means allows a mechanical free-play between the first and the second component;

connecting said first and second component with said third component via said second connecting means (13, 16) for each of the first and the second component for an electrical and/or optic connection of the first and the second with the third component; and limiting the free-play between the first and second component via said apparatus to limit the free-play (20, 21, 30, 31, 32, 34) between the first and the second component.

* * * * *